(12) United States Patent
Egnor et al.

(10) Patent No.: US 7,236,546 B2
(45) Date of Patent: Jun. 26, 2007

(54) PIPELINED TURBO MULTIUSER DETECTION

(75) Inventors: Dianne E Egnor, Somerville, MA (US); Robert B MacLeod, Nashua, NH (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 793 days.

(21) Appl. No.: 10/659,567

(22) Filed: Sep. 10, 2003

(65) Prior Publication Data

US 2005/0053173 A1 Mar. 10, 2005

(51) Int. Cl.
*H03D 1/00* (2006.01)
*H04L 27/06* (2006.01)

(52) U.S. Cl. .................. 375/341; 375/262; 375/340; 714/786; 714/794; 714/795

(58) Field of Classification Search ............... 375/341, 375/262, 340; 714/786, 794, 795
See application file for complete search history.

(56) References Cited

U.S. PATENT DOCUMENTS

2003/0012263 A1 1/2003 Lu
2003/0103558 A1 6/2003 Oates

FOREIGN PATENT DOCUMENTS

EP 1 024 601 A1 8/2000

WO WO 01-22610 A1 3/2001

OTHER PUBLICATIONS

Zhang, et al., Iterative Multiuser Detection for Turbo Coded CDMA in Gaussian and Non-Guassian Impulsive Noise, Lehigh University, pp. 1-19.
Verdu, Minimum Probability of Error for Asynchronous Guassian Multiple-Access Channels, IEEE Transactions on Information Theory, vol. IT-32, Jan. 1986, pp. 85-96.
Lupas, et al., Linear Multiuser Detectors for Synchronous Code-Division Multiple-Access Channels, IEEE Transactions on Information Theory, vol. 35, No. 1, Jan. 1989, pp. 123-136.
Lupas, et al. Near-Far Resistance of Multiuser Detectors in Asychronous Channels, IEEE Transactions on Communications, vol. 38, No. 4, Apr. 1990, pp. 496-508.
Alexander, et al. Iterative Multiuser Interface Reduction: Turbo CDMA., IEEE Transactions on Communications, vol. 47, No. 7, Jul. 1999, pp. 1008-1014.
Robertson, et al. A Comparison of Optimal and Sub-Optimal MAP Decoding Algorithms Operating in the Log Domain, IEEE, 1995, p. 1009-1013.

(Continued)

*Primary Examiner*—David C. Payne
*Assistant Examiner*—Erin M. File
(74) *Attorney, Agent, or Firm*—Maine & Asmus

(57) ABSTRACT

A multiple access processing system for a plurality of users employing a multiuser detector processing partial blocks of data within a window. The multiuser detector processes the data for all users within a processing window and is interrupted at successive frame boundaries. Once an entire block is processed by the MUD, the blocks for that user are decoded and the processing continues.

17 Claims, 5 Drawing Sheets

OTHER PUBLICATIONS

Hagenauer, et al. A Viterbi Algorithm with Soft-Decision Outputs and its Applications., GlobeCom '89, IEEE, 1989, pp. 1680-1686.

Pottie, et al. A Comparison of Reduced Complexity Decoding Algorithms for Trellis Codes, IEEE Journal on Selected areas in Communictaions, vol. 7, No. 9, Dec. 1989, pp. 1369-1380.

Berrou, et al. Near Shannon Limit Error- Correcting Coding and Decoding: Turbo—Codes(1), Proceeds ICC'93, IEEE 1993, pp. 1064-1070.

Berrou, et al. Near Optimum Error Correcting Coding and Decoding: Turbo-Codes, IEEE Transaction on Communictaions, vol. 44, No. 10, Oct. 1996, pp. 1261-1271.

Wang, et al., Low-Complexity MAP Decoding for Turbo Codes, IEE 2000, pp. 1035-1039.

Poor, et al., Turbo Multiuser Detection: An Overview, IEEE 6th Int. Symp. on Spread Spectrum Tech. & Appli., Sep. 6-8, 2000, pp. 583-587.

Wang, et al., Iterative (Turbo) Soft Interference Cancellation and Decoding for Coded CDMA, IEEE Transactions on Communications, vol. 47, No. 7, Jul. 1999, pp. 1046-1061.

Chan et al., A Class of Asymptotically Optimum Iterated-Decision Multiuser Detectors, Proc. Int. Conf. Acoust., Speech, Signal Processing (ICASSP-2001), Salt Lake, UT, May 2001.

Moher, An Iterative Multiuser Decoder for Near-Capacity Communications, IEEE Transactions on Communications, vol. 46, No. 7, Jul. 1998, pp. 870-880.

Das et al., Computationally Efficient Iterative Multiuser Detection and Decoding, IEEE, 1998, pp. 631-634.

Herzog et al., Iterative Decoding and Despreading improves CDMA- Systems using M-ary Orthogonal Modulation and FEC, IEEE, 1997, pp. 909-913.

Varansi et al, Multistage Detection in Asynchronous Code-Division Multiple Access Communications, IEEE Transactions on Communications, vol. 38 No. 4, Apr. 1990, pp. 509-519.

Tungsrisaguan, et al., Iteractive Sequential Multiuser Receiver for Asynchronous Coded CDMA Systems over Frequency-Selective Fading Channels, IEEE, 2003, 2552-2556.

Yu, Practical Iterative Multiuser Detection for Turbo Encoded Signals in CDMA systems, IEEE, 2002, 931-935.

Partial European Search Report dated Dec. 27, 2006, of European Application # 04077495.2 filed Sep. 8, 2004.

PIPELINED TURBO MULTIUSER DETECTION

RELATED APPLICATIONS

This application is related to PCT Patent Application No. PCT/US03/20098, entitled Windowed Multiuser Detection, filed Jun. 25, 2003, and is herein incorporated in its entirety by reference.

FIELD OF THE INVENTION

This present invention relates to advanced receiver techniques for processing signals in a multi-user environment, and more particularly to processing multiple user signals with a pipelining approach for Turbo Multiuser Detection (Turbo MUD) applications.

BACKGROUND OF THE INVENTION

Although Code Division Multiple Access (CDMA) or spread spectrum communications has been around for many years, there is an increasing interest in using spread spectrum systems in commercial applications to allow superior quality performance and a greater number of users within a given bandwidth. The digital format of CDMA architecture allows complex processing and high-level algorithms for transmission and reception.

In a CDMA system, each signal is transmitted using spread spectrum techniques. The transmitted informational data stream is impressed upon a much higher rate data stream termed a signature sequence. The bit stream of the signature sequence data is typically binary, and can be generated using a pseudo-noise (PN) process that appears random, but can be replicated by an authorized receiver. The informational data stream and the high bit rate signature sequence stream are combined by multiplying the two bit streams together, assuming the binary values of the two bit streams are represented by +1 or −1. This combination of the higher bit rate signal with the lower bit rate data stream is called spreading the informational data stream signal. Each informational data stream or channel is allocated a unique signature sequence.

In the operation of standard single-user receivers, a plurality of spread information signals each modulate a radio frequency (RF) carrier and may be jointly received as a composite signal at the single receiver. Each of the spread signals overlaps all of the other spread signals, as well as noise-related signals, in both frequency and time. The receiver correlates the composite signal with one of the unique time, frequency, or code sequences, and the corresponding information signal is isolated and processed. This is generally termed matched filtering. The FDMA, TDMA, or CDMA signals have been designed to separate in this fashion, and the desired information is retrieved.

In joint detection signal processing, the waveform appearing at the receiver is not processed by standard single-user processing, or a combination of several single-user processors. The joint detection processing more commonly referred to as Multiuser Detection (MUD), proceeds by computing the outputs for each user in one mathematical step, wherein data from each user is simultaneously considered. In the previous example for the single-user receiver, MUD is employed by replacing the matched filter with a decorrelator. In the operation of a decorrelator, the matched filter taps for each user is collected into a signature matrix (one column for each user), sometimes called the 'S' matrix.

The decorrelator would jointly compute the K bits $\vec{b} = (S^H S)^{-1} S^H r$, where r is the received data. This can be contrasted with the matched filters that would individually compute the single bit values (for each user k) $b_k = (s_k^H s_k)^{-1} s_k^H r$, where $s_k$ is the matched filter for the $k^{th}$ user.

There has been considerable research to address joint demodulation, which is further described in S. Verdu, "Minimum Probability of Error For Asynchronous Gaussian Multiple-Access Channels," IEEE Trans. Info. Theory, Vol. IT-32, pp. 85-96, R. Lupas and S. Verdu, "Linear multiuser detectors for synchronous code-division multiple-access channels," IEEE Trans. Inform. Theory, Vol. 35, pp. 123-136, January 1989; and R. Lupas and S. Verdu, "Near-far resistance of multiuser detectors in asynchronous channels," IEEE Trans. Commun., Vol. 38, pp. 496-508, April 1990. A description of CDMA communication techniques is further outlined in U.S. Pat. No. 5,506,861, which describes radio-telephone communication systems, and in particular, receivers for jointly demodulating a plurality of CDMA signals with multipath time dispersion.

There are a host of approaches for jointly demodulating any set of interfering digitally modulated signals. Maximum Likelihood Sequence Estimation determines the most likely set of transmitted information bits for a plurality of digital signals without multipath time dispersion. The maximum likelihood joint demodulator is capable, in theory, of accommodating the largest number of interfering signals, but has a prohibitive computational complexity that makes it commercially impractical. The decorrelation receiver is another, less computationally complex receiver processing approach that zeroes out the interfering signals, or decorrelates the different signals. The decorrelator, as well as virtually every other lower complexity joint demodulator, is generally non-operational when the number of signals is over a set threshold which falls significantly short of the theoretical maximum.

There are various multiuser detectors known in the art, including optimal or maximum likelihood MUD, maximum likelihood sequence estimator for multiple interfering users, successive interference cancellation, TurboMUD or iterative MUD, and various linear algebra based multi-user detectors such as those detailed in the well-known text "Multiuser Detection" by Sergio Verdu. In basic terms, turbo-decoding refers to iteratively passing information in the form of temporary or provisional bit decisions between a MUD processing block, and a decoding processing block, wherein for a turbo MUD the data is coded at the source.

The Viterbi algorithm is a method for decoding convolutional codes, and is a maximum-likelihood decoding method that minimizes the sequence-error probability for convolutional codes. To minimize the symbol-error probability, Bahl, Cocke, Jelinek, and Raviv (BCJR) published a forward-backward a posteriori probability (APP) decoding algorithm, the BCJR algorithm. The BCJR algorithm has seen an increased activity in coding field in relation to turbo decoding because it computes and stores likelihoods at each step, and can therefore provides more precise information to the MUD.

A MUD algorithm within the TurboMUD system determines discrete estimates of the transmitted channel symbols, with the estimates then provided to a bank of single-user decoders (one decoder for each user) to recover the input bit streams of all transmitted signals. Two general types of multi-user detectors within the TurboMUD system are possible, namely those that provide hard outputs, which are discrete values, and those that provide soft outputs, which indicate both the discrete estimate and the probability that the estimate is correct.

A further description of a TurboMUD system is described in an article by Paul D. Alexander, Mark C. Reed, John A. Asenstorfer and Christian B. Schlagel in IEEE Transactions on Communications, vol. 47, number 7, July 1999, entitled "Iterative Multi-User Interference Reduction: Turbo CDMA", wherein multiple users transmit coded information on the same frequency at the same time.

In a Turbo MUD system, decoding and confidence information is passed between the multiuser detector and decoder components. Maximum a posteriori (MAP) decoders or approximations of MAP decoders are well known to those in the art and are used for both the MUD and single user (SU) decoders so that soft output information is available if desired. The filtered signal is typically then passed into a MUD detector. In the optimal case, the MUD detector is a full-complexity MAP detector. Suboptimal reduced complexity MAP-based approaches are known in the relevant art.

In the state of the art, the MUD detector passes soft decisions in the form of reliability, or confidence, measures to the single user decoders. The reliability measures are presented with one associated with each symbol of each user to the bank of decoders. If the signals were transmitted with interleaving, the reliability measures from the MUD are first passed through a deinterleaver and passed on in shuffled form to the decoder. Shuffling refers to same values but changes the placement or presentation of the values.

MAP decoding is known in the art and further described in C. Schlegel, Trellis Coding, IEEE Press, 1997; Robertson, Villebrun and Hoeher, "A Comparison of Optimal and Sub-Optimal MAP Decoding Algorithms Operation in the Log Domain," ICC95; Hagenauer, and Hoeher, "A Viterbi Algorithm with Soft-Decision Outputs and its Applications," Globecom 89; Pottie and Taylor, "A Comparison of Reduced complexity Decoding Algorithms for Trellis Codes," J Sel. Areas in Comm December 1989. The iterative turbo principle, on which Turbo MUD is based, is described by Berrou, Glavieux, and Thitimajshima, "Near Shannon Limit Error-Correcting Coding and Decoding: Turbo-Codes (1)," ICC 93; Berrou and Glavieux, "Near Optimum Error Correcting Coding and Decoding: Turbo-Codes", Trans on Comm, October 1996; and Wang and Kobayashi, "Low-Complexity MAP Decoding for Turbo Codes", Vehicular Technology Conference 2000]. Turbo MUD approaches are described in, for example, Alexander, Reed, Asenstorfer, and Schlegel, "Iterative Multiuser Interference Reduction: Turbo CDMA," Trans on Comm, July 1999; Poor, "Turbo Multiuser Detection: An Overview, " ISSSTA 2000; and Wang and Poor, "Iterative (Turbo) Soft Interference Cancellation and Decoding for Coded CDMA", Trans on Comm, July 1999.

Any of the known MUD algorithms can be used as the MUD processing block in a turbo MUD algorithm. The turbo MUD generally outperforms a simple MUD/decode processor because the processing blocks in the turbo configuration are allowed to share information in the form of the provisional bit decisions, rather than each processor operating autonomously. The MUD algorithm within a Turbo MUD system computes estimates of the transmitted channel symbols and passes them to a bank of single-user decoders (one decoder for each user). This process proceeds for several iterations, eventually recovering the input bit streams of all transmitted signals.

For these reasons, to achieve real-time performance by reducing the computational complexity of an iterative multiuser, the state of the art suggests linear algorithms for the MUD processing block rather than optimal MUD or the T and M algorithm counterparts. It is well known that the reduction in performance of the linear MUDs can be offset by the gains due to the iteration in the turbo MUD. For example, it is not uncommon that five iterations in a turbo MUD between a linear MUD and a decoder can obtain optimal MUD like performance with fewer computations, even though the processing is repeated five times.

Higher complexity algorithms such as M-algorithm, T-algorithm, FANO or reduced state Viterbi consume more processing time, but produce a more accurate decisions tree. Lower complexity linear MUD algorithms consume less processing time but may not be as accurate. It should be understood that the present invention, as described herein, can use any tree pruned search for the MUD in order to perform suboptimal searching to tree prune without having to do every search. It should also be apparent to those skilled in the art that any higher order tree pruned search such as FANO, M-algorithm, T-algorithm or reduced state Viterbi can be used for the MUD processing.

The MUD outputs a bit (or symbol) stream to a bank of error correcting decoders. In one embodiment of this invention, the decoders provide soft output streams of values associated with the bit streams of each interfering user's signal present in the received signal. MUD can employ any of the soft decision input soft decision output multiuser detector such as a linear-based soft decision MUD known in the art such as Chan and Wornell, 'A Class of Asymptotically Optimum Iterated-Decision Multiuser Detectors', and Wang and Poor, 'Iterative (Turbo) Soft Interference Cancellation and Decoding for Coded CDMA', IEEE Trans. on Comms, July 1999, and Moher, "An Iterative Multiuser Decoder for Near Capacity Communication," IEEE Trans. on Comms., v46, n7, July 1998. The system can also provide hard decisions with the MUD and bank of decoders described in the art for a reduced multi-access interference linear multiuser detector and hard decision error correction decoder.

The growing demand for radio communications raises the need to optimize the performance while maximizing the capacity of wireless communications systems. What is needed is an efficient signal processing technique to improve the quality and spectral efficiency of wireless communications and better techniques for sharing the limited bandwidth among different high capacity users. As can be seen, attempts to make real-time processing multi-user processing have been frustrated by complex and sophisticated hardware and processing requirements.

BRIEF SUMMARY OF THE INVENTION

The invention is devised in the light of the problems of the prior art described herein. Accordingly it is a general object of the present invention to provide a novel and useful technique that can solve the problems described herein.

A summary objective of the invention is to provide a more efficient Turbo MUD on frame asynchronous multiuser signals by using a particular ordering (pipelining) of the processing elements of the Turbo MUD algorithm. A further object is an optimal pipelining of a MUD turbo processing for decoding multiple access interferences of signals that have been encoded by forward error correction methods.

As described herein, state of the art TurboMUD is not well-suited for frame-asynchronous operation as there are inherent delays that contribute to inefficiency. The Turbo MUD systems pass blocks of soft data between a MUD module and a decoding module to accomplish the demodulation. It is typical that upon transmission the data has been coded into a frame of symbols and thus cannot be retrieved at the receiver until an entire frame is available to the decoder module of the receiver. The state of the art Turbo MUD typically requires that the blocks of data passed around in a turbo decoder correspond exactly to the size of a coded frame of symbols. Such a configuration is possible when the reception of each user's frame-data can be precisely lined up with the blocking structure established in the turbo loop for a frame-synchronous situation.

In the frame-asynchronous scenario, there are various schemes to expand the processing blocks to encompass all of the symbol frames user-by-user to be decoded. This has numerous disadvantages, including tracking symbols from previous and subsequent frames, complicating the processing.

An object of the present invention is to reduce complex processing for MUD applications such as IS95 CDMA and provide improved processing times. The processing delays of the state of the art, which correspond to the delays waiting for each user to complete a frame of MUD processed data before passing along the data to the decoder, are reduced with the pipelined approach of the present invention. The subsequent MUD processing blocks are not delayed but are executed immediately by parallel processing elements.

One aspect of the invention is an apparatus for processing asynchronous data in a multiple access system, comprising a plurality of received signals from a corresponding plurality of users, wherein the received signals are divided into blocks of data for each of the users. There is a plurality of multiuser detector processors coupled to the received signals, wherein each of the multiuser detector processors processes a portion of the blocks for each of their users within a processing window. There are also a plurality of decoders coupled to the multiuser detector processors, wherein the decoders process all the blocks for one of the users once the multiuser detector processor is finished processing an entirety of one of the blocks for the one of the users.

A variation of the present invention includes the apparatus wherein each of the received signals are respectively coupled one of the multiuser detector processors, and wherein each of the multiuser detector processors are respectively coupled one of the decoders.

According to the teachings of the present invention, various decoder algorithms and multiuser detector algorithms can be employed. As an example, the decoders can use algorithms selected from the group of algorithms consisting of Viterbi algorithm and Bahl, Cocke, Jelinek, and Raviv (BCJR) algorithm. With respect to the multiuser detector processor, examples of algorithms include those selected from the group consisting of M-algorithm, T-algorithm, FANO, or reduced state Viterbi, maximum a posteriori (MAP) decoders and soft-output Viterbi algorithm (SOVA) decoders.

The present invention can further comprising a parameter estimator coupled to the received signals and to the multiuser detector processors, wherein a size of the processing window is determined by the parameter estimator. Additional elements can include an interleaver coupled between the multiuser detector processors and the decoders and a deinterleaver coupled between the decoders and the multiuser detector processors.

In one embodiment, the invention is a digital processing system performing Turbo MUD processing on multiple access communications, comprising a parameter estimation unit coupled to a plurality of received user signals, wherein each of the user signals are a plurality of blocks of data. There is a multiuser detector coupled to the parameter estimation unit, wherein the multiuser detector processes the blocks of data for each of the user signals in a partial manner with a processing window defined by frame boundaries. The multiuser detector outputs processed blocks of data, and there are a bank of decoders coupled to the multiuser detector. The decoders process all of the processed blocks of data for one of the user signals as soon as one of the blocks of data for one of the user signals has been processed by the multiuser detector in its entirety. The decoders produce improved processed blocks of data.

The iterative processing aspects of the present invention are realized when the improved processed blocks of data are fed back to the multiuser detector.

A further variation of the present invention includes where the processing window is edge triggered or commences processing on a central bit.

Another element applicable to the invention further comprises a synchronization unit coupled to the multiuser detector determining which of the processed blocks of data to decode.

An additional aspect of the invention includes a method for processing signals from multiple users, each having synchronized bit streams within blocks of data. The method comprises performing parameter estimation of the bit streams and processing the bit streams using a multiuser detector, wherein the multiuser detector processes a portion of each of the blocks of data within a frame boundary. Other steps include interrupting the processing at each frame boundary, wherein one of the blocks of data is completely processed for one of the users at each frame boundary. Next, decoding all of the blocks of data from the multiuser detector for one of the users and producing a higher quality symbol bit stream. The next step includes refreshing the blocks of data and repeating the steps of interrupting, decoding and refreshing until a final state is obtained. A further step includes outputting a final symbol stream for each of the users.

A variation on the method for processing signals from multiple users is wherein the final state is a fixed number of iterations or an allowable performance level. Another variation includes wherein the processing method includes processing being performed in parallel and performed sequentially. Further steps can include de-interleaving and interleaving.

The subject of the invention disclosed in this application does not require that the signals correspond to any particular multiple access (MA) scheme or even that they are all of the same type, or come from a wireless system. For example, the present invention operates in the same manner on any set of digitally modulated interfering signals to include cellular CDMA systems, TDMA systems, FDMA systems, storage medium, wired MA systems such a cable modems, wireless local area network systems, or yet undetermined systems.

One embodiment of the present invention is that each signal source produces a signal with the information digitally modulated using a signature pulse or finite duration signal of some sort. While CDMA is described for illustrative purposes to explain the invention, the specific example of CDMA is merely for ease of understanding. The present invention is directed to any other form of digital communication or signal storage methods and the terminology used in the CDMA discussions such as "signature sequence", "signature signal", and "signature pulse" shall be deemed equivalent. Likewise, the wording of "CDMA signal" and "digitally modulated signal" shall also be considered as equivalent with respect to the capabilities of the processing of bits. Thus, the present invention is not limited to CDMA and is equally applicable to any digitized communication protocol.

A further feature of the present invention is that it works equally well using mixed rate communication systems such as IS95, wherein the user chooses the transmission rate. The parameter estimator that handles the differing transmission rates passes along the information to the present system.

Still other objects and advantages of the present invention will become readily apparent to those skilled in this art from the following detailed description, wherein we have shown and described an embodiment of the invention, simply by way of illustration for carrying out our invention. As will be realized, the invention is capable of other and different embodiments, and its several details are capable of modifications in various obvious respects, all without departing from the invention.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The methods and embodiments of the Pipelined Turbo-MUD disclosed herein enable implementations of advanced receiver processing providing high quality real-time processing for multiple access systems. The preferred embodiment is an illustration of the digital processing technique that is applicable to many variations and applications all within the scope of the invention.

The turboMUD approach, in general, repeats the processing steps of decoding and multiuser detection several times before an output is produced. The convolutional code imparted on the data at the source(s) provides a certain data dependency in time, while the multi-user reception provides a certain data dependency amongst users. The present invention provides for computational efficiency by interrupting the processing of the MUD at each frame boundary to perform decoding before re-establishing the frame boundaries and continuing processing. Each of these interruptions spawns a new processing thread in the receiver hardware which allows more effective use of the MUD processing threads as they do not have the delays found in other processing schemes.

Figure 1:
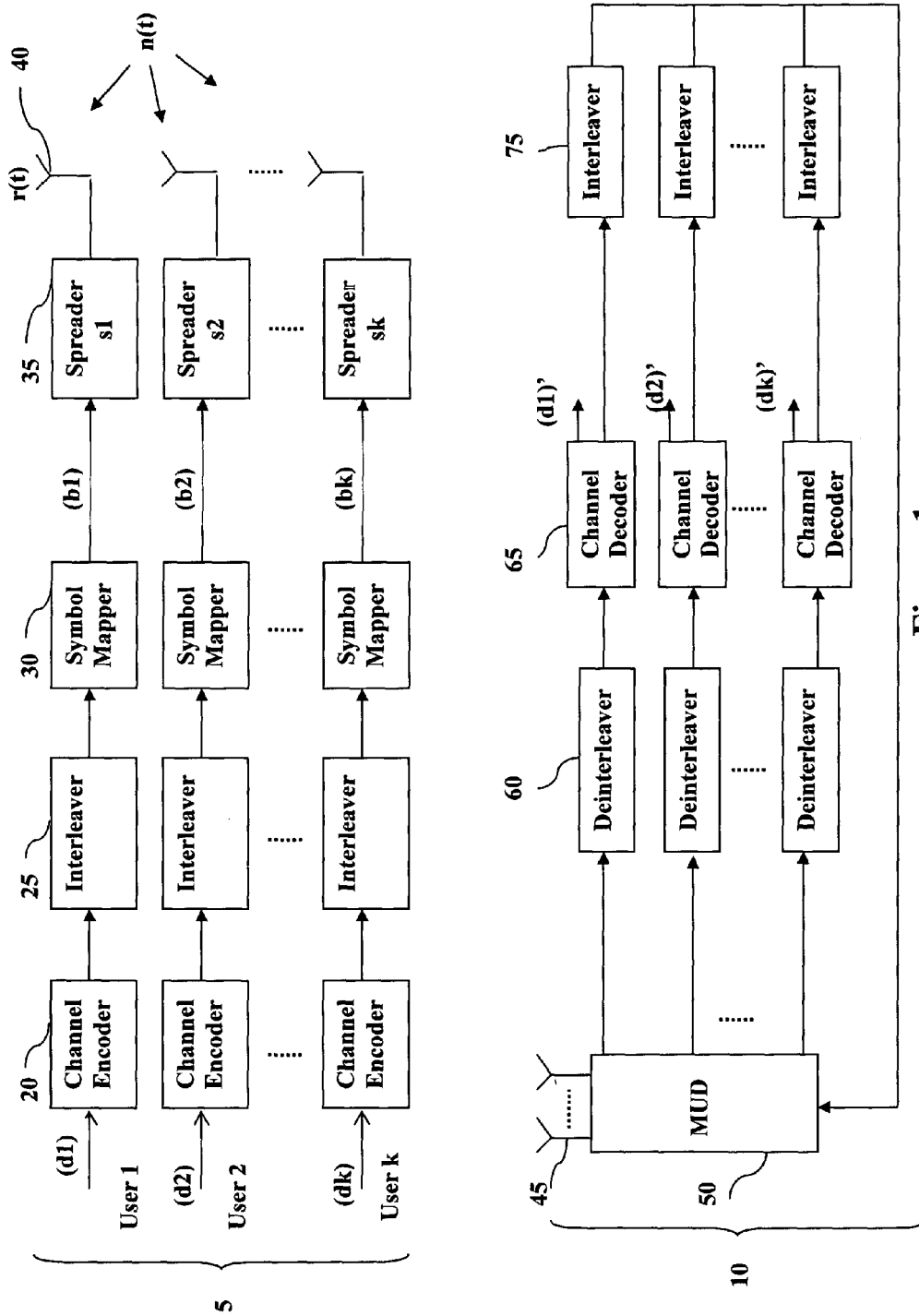
FIG. 1 illustrates a basic diagrammatic processing perspective for the prior art transmitter end and receiver end with iterative multiuser detection processing.

In order to fully appreciate the processing of the present invention, it is useful to consider a description of the processing known in the art. Referring to prior art FIG. 1, transmitter section 5 and receiver section 10 are depicted with MUD processing. There are K users with data $d_1$-$d_k$ as the input to the channel encoders 20 where the data is convolutionally encoded at a code rate $R_k$. The interleaver 25 performs the interleaving of the data, which is then symbol mapped by the symbol mapper 30, such as BPSK symbol mapped with data symbols having a duration T. Each data symbol is then modulated by a spreading waveform from the spreader 35, and the signal data $S_k(t)$ is output from the transmitter end with a number of data symbols per user per frame. The data is generally transmitted by antennas 40. The transmission on hard-wire or fixed wire systems is also known in the art, however the present example is directed towards the wireless communications systems. Noise n(t), such as white Gaussian noise, is an inherent component of most transmission signals and some random noise components are generally present in transmitted data signals r(t).

On the receiving end 10, antennas 45 receive the transmitted signals r(t) as well as the various interfering signals, such as n(t). There is an iterative processing topology with a MUD section 50 that interacts with the K number of channel decoders 65 for the received signal r(t) for each user. The multiuser detector 50 is generally a SISO detector, receiving and outputting soft values. The MUD section 50 utilizes a priori information and delivers values such as a posteriori log-likelihood ratio (LLR) data of a transmitted '+1' or '−1' for each bit of every user. Certain a priori information is computed by the channel decoder 65 from a previous iteration which is interleaved and fed back to the MUD section 50. The interleaver 60 and deinterleaver 75 perform the interleaving and deinterleaving functions respectfully for the encoding schema. Once the processing is complete the channel decoders 65 produce the output data stream (dk)' representing the best estimate of the transmitted signal (dk).

Various schemes for Turbo MUD processing are well known in the art and utilize a priori information about the received signals wherein the processing continues through a number of iterations until certain conditional parameters are satisfied. The basic Turbo-Mud procedure is presented in published literature such as Poor, "Turbo Multiuser Detection: An overview," IEEE $6^{th}$ Int. Symp. On Spread-Spectrum Tech. And Appli., NJIT, New Jersey, Sep. 6-8, 2000 and Alexander, Reed, Asenstorfer, and Schlegel, "Iterative Multiuser Interference Reduction: Turbo CDMA," IEEE Trans. On Comms., v41, n7, July 1999. The iterative MUD algorithm such as representative of the approaches used to incorporate turbo decoding methods into joint MUD/FEC (Fourier Error Correction) decoding and to then reduce the complexity of the system are known in the art.

Figure 2:
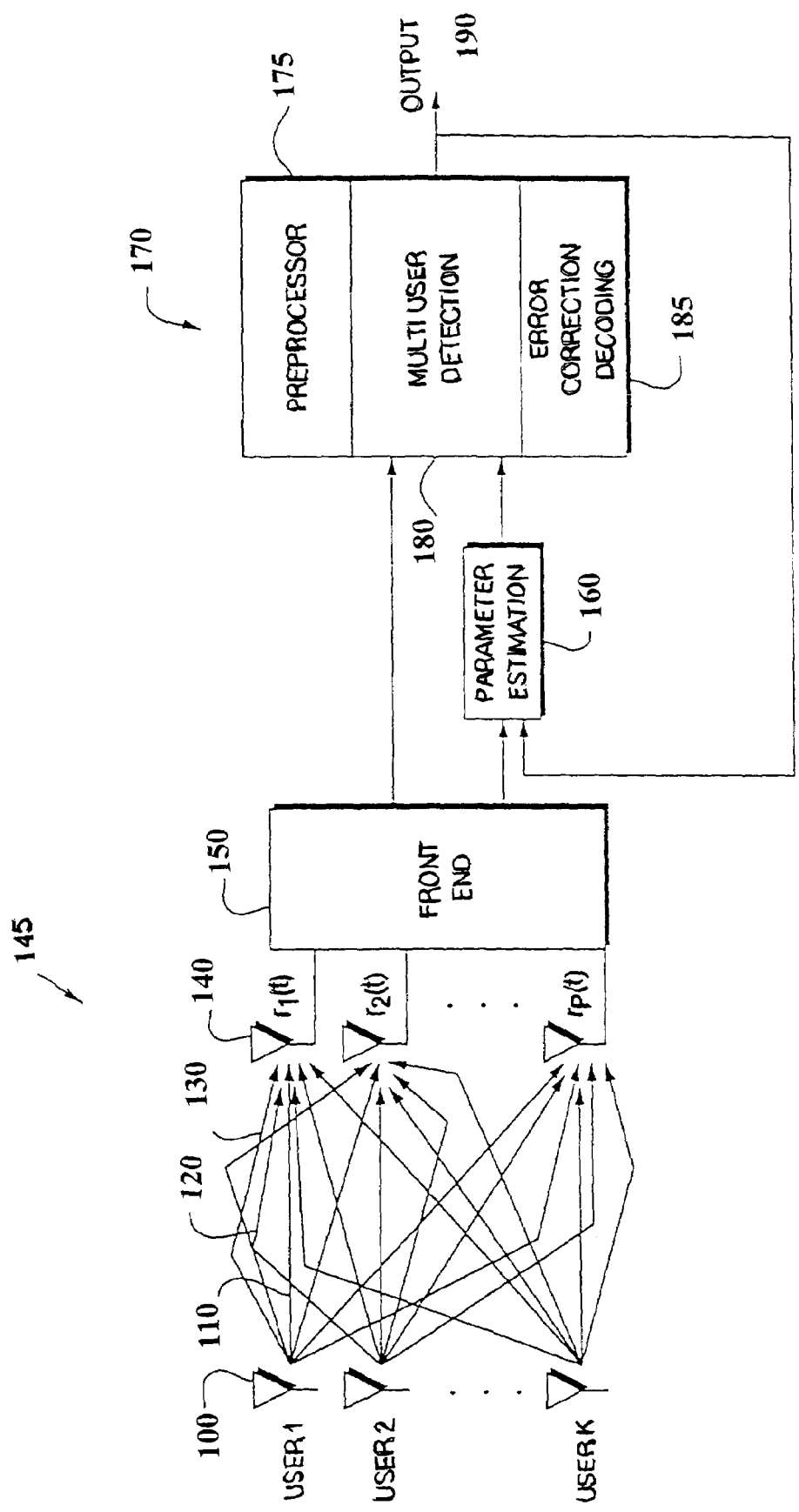
FIG. 2 depicts a wireless communications system showing transmitted signals with interference received and processed by a front end and the basic TurboMUD blocks of parameter estimator, multiuser detectors, and decoders and the respective coupling.

The wireless communication application is further presented in FIG. 2, wherein a number of users (1-K) generate signals that are sent by transmitters 100 into free space. There is normally a noise component n(t) 145 that is introduced from the environment of a random nature in the received signal. While any noise that has a repeatable or non-random nature can be eliminated through processing, random noise elements are reduced in other manners such as filtering but are inherent conditions. The various signals are received at antennas (1-p) 140 wherein there is one signal for each polarization feed. The signals represent directly received signals 110, as well as multi-path signals from the same user 130, and interfering signals 120 from other users.

The plurality of signals from each antenna 140 is processed in a RF front end unit 150. The front end unit 150 downconverts the higher frequency signals into baseband signals and provide processing and filtering as is known in the art. The baseband signals are also digitized by analog to digital converters (ADC). The front end 150 cooperates with the parameter estimation unit 160 to retrieve needed information for the signals such as relative received timing offsets, carrier phase, frequency offsets, received amplitudes, and multipath structure for each of the interfering signals present in the received signal.

The MUD element 170 consists of functional blocks that process the digital data and extract the user symbol streams. The pre-processor 175 converts the baseband digital data into the proper format for further processing according to the desired detection scheme. The format is often one measurement per 'dimension' per symbol. An example of this processing is a bank of matched filters. The multi-user detection stage 180 as detailed herein cooperates with the error correction decoding (ECD) 185 for iterations of the processing of the Turbo-Mud.

An input signal of raw non-manipulated data at the receiver is comprised of the aggregate of many signals from many different transmitters, where each signal is assigned a channel (frequency, timeslot, and/or spreading code) from a finite set of channels. The interference from these various users generally requires complex processing and associated processing time. The aggregate signal is collected at the receiver, down-converted and digitized. This digital input signal or raw input data is then input to the turbo multiuser detector (MUD) system 170.

The basic Turbo MUD 170 assumes knowledge of various parameters such as relative received timing offsets, carrier phase, frequency offsets, received amplitudes, and multipath structure for each of the interfering signals present in the received signal. This input data represents raw data after some front end processing such as downconversion, amplification, and analog-to-digital conversion. All MUD systems 170 need some raw data parameters in order to establish accurate decision trees for processing.

The input data represents a vector of data, transferred at some rate (e.g., the symbol rate), and this data is typically transmitted to a matched filter (not shown). In addition, the same vector is passed on to the parameter estimation module 160. The purpose of the parameter estimation module 160 is to estimate timing, signal amplitudes, phases, polarization, and identification of transmission channels.

A parameter estimation unit 160 processes the various parameters for the received raw data. A parameter estimator, as known in the art, is a broad description for a unit that provides information to the MUD and decoders such as convolutional code, signatures, multiplexing format. While the term parameter estimator is used herein, the term is intended to be interpreted in the broader sense as known in the joint demodulation field. The multiuser detection unit 180 outputs a bit (or symbol) stream associated with each interfering signals present on the channel for one data block. Deinterleavers and interleavers (not shown) are optional elements that are used if the transmitted signals are interleaved, such as the CDMA format and are known in the art.

The bit streams from the MUD 180 are passed to a bank of error correction decoders unit 185. The iterative MUD or Turbo MUD can be structured as a hard output or soft output processing. In order to demonstrate the present variation, the soft output version is addressed herein, but it is within the scope of the present invention to utilize hard outputs. The decoders 185 calculate conditional probabilities, one for each decoded symbol of each user, and output them as confidence values back to the MUD 180. In one embodiment, there is a bank of error correction decoders 185 that provide soft output or restore values associated with prior probabilities. Viterbi decoders can be used, that generates output hard values while soft input soft output decoders, such as MAP, may also be used.

Soft outputs for each bit of each user from the bank of decoders 185 is fed back to the multiuser detector 180 for each iteration, one stream of outputs for each interfering user present in the received signal. These soft outputs are passed back to the MUD 180 to produce an improved stream of soft bit (or symbol) decisions that fed into the decoder for another iteration of improvement. The information between the MUD 180 and the decoders 185 repeats in subsequent iterations until an asymptote is reached or the desired performance level is attained. At that point, estimates of the data sequences for all active users are output 190. Operation then commences for the next block of data, repeating the process described above. The multiuser detector 180 takes these soft inputs along with the original raw input signal to calculate an improved, less corrupted bit stream for each user. This iterative process continues until a desired metric is reached or a fixed number is reached. At that point, estimates of the data sequences for all active users are output. Operation then commences for the next block of data, repeating the process described above.

The number of iterations for processing between the multiuser detector 180 and the decoders 185 can be set to a fixed counter or by checking if there were significant changes to the data from the last iteration. Once the data is no longer being altered or reaches a certain iteration counter limit, the data from the decoder 185 can be output as final estimates of what the user sent. A fixed number of iterations can be stored and used and processed by the decision block. Alternatively, the information between the multiuser detector 180 and the decoders 185 repeats in subsequent iterations until an asymptote is reached or the desired performance level is attained. A buffer (not shown) can store the previous values and compare them to the latter processed values during the iterative process.

When processing is completed, the system 170 outputs the final stream of decisions or output data stream for each interfering user for the current data block. The process is repeated for all subsequent data blocks. With respect to the pipelined approach of dealing with processing of partial blocks of data according to the present invention, the interaction between the multiuser detection section 180 and the error correction decoding 185 is explained in further detail herein.

Figure 3:
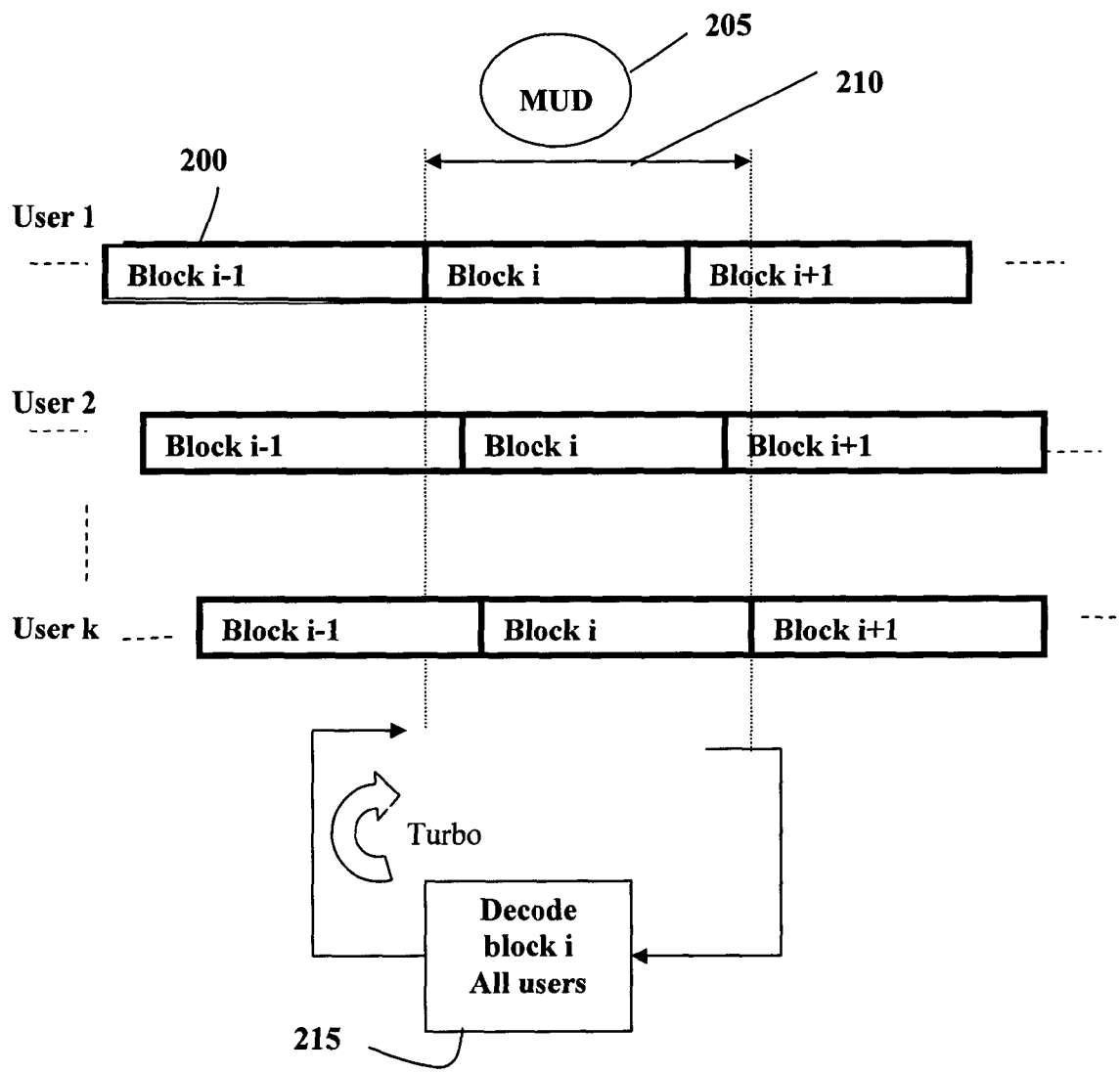
FIG. 3 depicts the prior art turbo processing of blocks of data for multiple users.

Referring to FIG. 3, the prior art presentation of the TurboMUD data flow is shown for users, User 1 to User k, wherein it is generally understood that the multiple users have various delays with respect to each other. Thus, typically the blocks of data 200 for each user arrive at the receiver with an offset with respect to each other and are thus asynchronous. Each block 200 consists of a series of transmitted symbols that can be of any length, but is typically several hundred symbols long.

Turbo MUD processing is accomplished by selecting a frame of data 210, which typically encompasses at least a full block of data for each user, wherein the frame of data 210 is processed by the MUD 205 and passed to the decoders. The MUD 205 known in the art generally processes an entire data block 200 within a single frame of data 210. For example, frame 210 shows the frame boundaries which includes all of the blocks 'i' for each of the Users 1-k. Only complete blocks 200 of data can be decoded, so the MUD 205 processing is performed for all of the symbols for a given frame 210 before decoding the results.

While a single block 200 of data for a single user has respective boundaries establishing a beginning and an end, the frame asynchronous nature of the received signals from multiple users includes offsets or delays between respective blocks from respective users. It is not possible for a single MUD processor 205 to employ a small frame window 210 approximately equal to the length of a single block 200 and generate the information needed by the decoders. Likewise, waiting until all the users' blocks have been received to process a single block for all users imparts a significant idle time where the MUD processor 205 waits for the signals to be received. This is because enlarging the processing window 210 to encompass all the delayed blocks of data leaves the MUD processor idle until all blocks are received.

For example, MUD processing requires that the processing window 210 includes frame 'i' for user 1 and frame 'i' for user 2, etc. . . . . Therefore the processing window is at least as wide as any single block 200 of data. The step is repeated for a number of iterations for each user before proceeding to the next frame of data, including blocks 'i+1' for example. This single frame processing a chunk of data in a serial fashion for each user and then decoding that single frame before proceeding to the next frame is inherently inefficient. This prior process includes waiting for other processing to finish, incurring idle time of the MUD processing that lowers computational efficiency.

Figure 4:
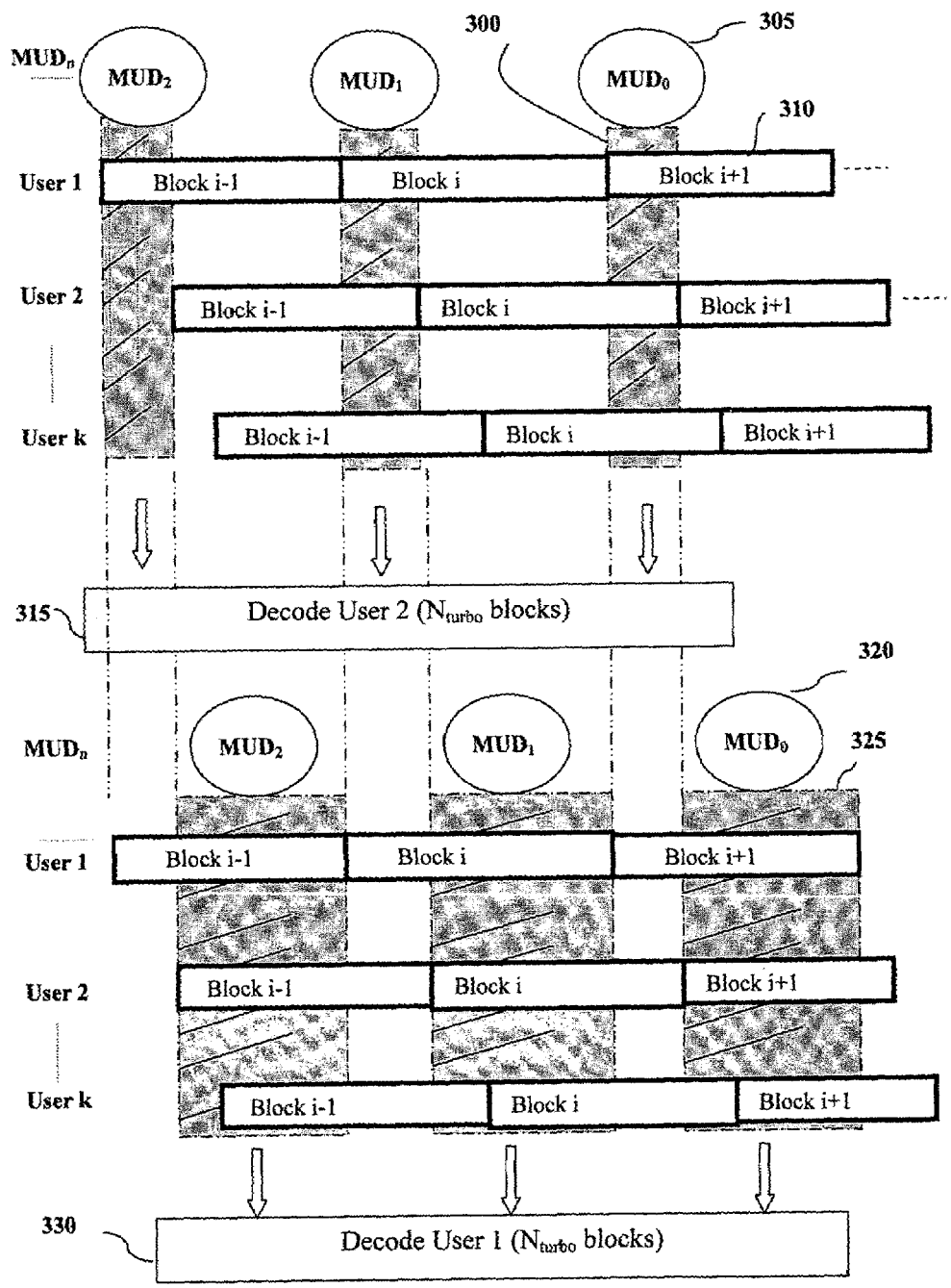
FIG. 4 illustrates one perspective of the pipelined MUD processing approach for multiple users undergoing processing by multiple MUD units.

FIG. 4 illustrates a presentation of the pipelined Turbo Mud processing for the frame asynchronous processing according to the present invention. The processing is executed in a different manner than processing known in the art in which the MUD processors process whole frames and wait for all frames to be completed. The prior schemes do not allow for partial frame processing, wherein the asynchronous nature of the various frames from multiple users results in certain users not being fully encompassed by the MUD processing window.

In the present invention, partial blocks are processed for all users thereby reducing idle time in the MUD processors. Once an entire block has been processed, the data in that block is updated or otherwise replaced and all blocks for that user are decoded. In one embodiment, the present invention processes multiple blocks of data in parallel, wherein each is spaced approximately one block apart, with the boundaries extending to the next block transition. The processing is based upon time, wherein each of the plurality of MUD processors are operating on older and older data with respect to the time element, until the MUD processor shown as MUD N_turbo-1 is executed and the results decoded.

The 'Data In' in this embodiment represents waveforms from multiple users transmitting signals which are received and processed by the receiver units. The data is divided in blocks 310 for each user, the blocks 310 shown for illustrative purposes are represented as i−1, i, and i+1 for each user and represent three blocks of date wherein block i−1 represents the oldest data. The blocks 310 for subsequent users are not lined up or entirely within the same boundary frame 300 subject to processing by a single MUD processor 305, but rather have some delay element.

As shown in the upper portion of FIG. 4, MUD processors 305, including $MUD_0$, $MUD_1$ and $MUD_2$ has a 'window' or frame region 300 in which it processes data. In general, the MUD window 300 processes small chunks of data. It should be understood that the bits generally represent original processed bits as well as those that have undergone further processing and have different levels of maturity. The size of the MUD processor window 300 or sub-window can be any size such as 1 bit wide, an entire block width, or any size that allows for efficient processing for a given application. The processing for the window 300 can be edge triggered or commence processing on a central bit and encompass a certain number of bits on either side of the central bit. It should be understood that the frame boundary locations are provided by the initial parameter estimation and remain the same as long as the user is active. Each of the bit outputs from the MUD can be considered to be flagged with the user and location in time, both absolute and relative to the frame edge. The 'trigger' can be activated when the flag has a particular value.

As graphically illustrated, the MUD processors 305, identified as $MUD_0$, $MUD_1$ and $MUD_2$ process the partial frame data within the boundaries 300 at the same time, regardless of the asynchronous framing aspects of the data as it streams through the processing. $MUD_0$ sees the most recent data and tries to process the first portion of block i+1 for User 1 and simultaneously processing the last portion of block i of User 2. There are many MUD processors 305 simultaneously processing data blocks 310 as the streams of data process through the system.

At some point in time, as soon as an entire block of data 310 has been processed through the MUD processor 305, the data must be decoded for that User. The data is 'replaced' or refreshed so that that next MUD processor sees a different set of data.

More specifically, referring again to FIG. 4, which graphically illustrates a snapshot in time for a plurality of MUD processors 305 processing partial blocks of data 310 within the processing window 300. The MUDs 305 process the block data 310 within the processing window 300, including the data from multiple Users, herein shown as User 1, User 2 and User k. The size of the processing window 300 is determined by the frame boundaries as established by the parameter estimator (not shown), wherein the processing window 300 commences at the beginning of the frame of data from User 1 up until the beginning of the frame of data of User 2, and so on. Thus, the $MUD_0$ processes the end of the frame from User 2 as well as the beginning portion of the frame of User 1.

As soon as $MUD_0$ has processes the last bit from User 2 block i, $MUD_0$ must now pass on the data for decoding all the blocks for User 2 and replace the data before processing the data within those frames in the next MUD iteration. Therefore, once the MUD's 305 are finished processing User 2 frame, in the next instant, all User 2 frames are decoded 315. The processing can be done sequentially or in parallel employing the processing scheme of the present invention.

The lower portion of FIG. 4 illustrates a subsequent processing, wherein the MUD processors 320 are processing the blocks of data 310, including the refreshed data for the blocks of User 2. The processing window 325 in this instant begins at the beginning of the block from User 2 and extends to the beginning of the block of the next User who will have a block completed by this frame, in this case it happens to be user 1. As shown, $MUD_0$ is processing the last portion of block i+1 for User 1, $MUD_1$ is processing the last portion of block i for User 1, and $MUD_2$ is processing the last bit of block i−1 for User 1. At the next instant in time after the last portion of the blocks i−1, i, and i+1 of User 1 has been processed, the data from User 1 is decoded 330 and the data for User 1 is refreshed or replaced.

It should be appreciated at this point, that as time marches on, block i+1 will be processed in turn by MUDs 1, 2 and so on. Prior to reaching each of these MUD processors 320, the block i+1 data will have passed through several MUDs and decodings, each time being replaced with the newly computed values. In this fashion the iterative or turbo MUD processing is accomplished. The processing continues as noted herein, and the decoding process is further illustrated in FIG. 5.

It should readily apparent that the processing can be accomplished sequentially, with the MUD computations occurring one after another instead of in parallel. In this implementation, this invention retains its properties of not doing extra or duplicate computation and of producing results with the minimum lag or computational delay.

Figure 5:
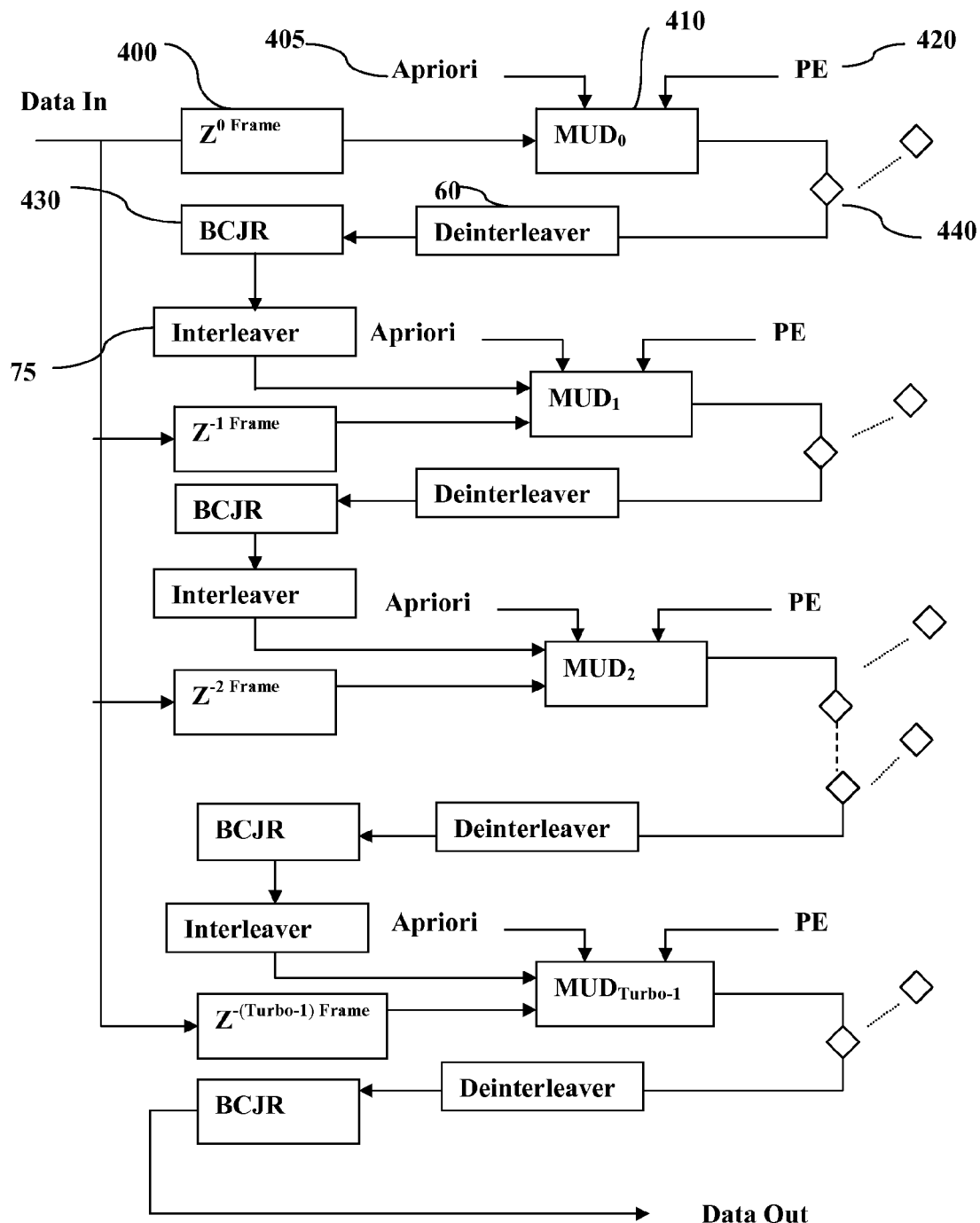
FIG. 5 depicts a single user perspective representation of the pipelined approach wherein multiple user layers are coupled and synchronized.

Referring to FIG. 5, single user perspective of the processing of the present system is shown illustrating the interaction between the MUD processors and the decoders. This single user perspective is employed to explain the principles of operation, however it should be understood that multiple users would have a similar configuration and are coupled to each other and the processing is synchronized among the users.

The 'Data In' represents blocks of data that are partitioned according to the code scheme used for the transmission/reception. The blocks of data 400 for each user are asynchronously delayed with respect to each other by some time interval as described herein. A plurality of MUD processors 410 are coupled to the incoming frames of data 400. The MUD processors 410 are coupled to some form of parameter estimator 420 to obtain signal information for processing the data, as well as an interconnection to a priori information 405. The MUD processors 410 are also coupled to decoders 430, such as the BCJR decoders, used in this example for decoding the completed frames of data.

The first block 400 of data, block 0, is communicated to $MUD_0$ along with the a priori information 405 and parameter estimation 420 values as is known in the art. The $MUD_0$ processes the partial frame of data within the processing window as detailed in the FIG. 4 description. Upon completion of any complete frame, the output from the $MUD_0$ is an input to a decoding algorithm such as BCJR. The BCJR processes the data and provides the input to the next stage, $MUD_1$. The data input values, delayed by one frame, are input the $MUD_1$ along with the respective apriori and parameter estimator (PE) information. The output of the MUD1 stage is input to the next parallel processed data frame and continues until the last stage at which point the output from the BCJR is the output values of the system, Data Out. The Data Out is the symbol stream of improved and processed data.

The information passed from the MUD processors 410 to the decoders 430 encompass the decisions made as part of the MUD processing in establishing the most probable conditional values for the data in the frame. For simplicity, the decoders 430 can be thought of as a storage register that holds the data that has been decoded at least once, wherein the MUD processors 410 are not ready to pass all Users through the decoding stage at once. Once a User has a complete block processed by the MUD that User is selected and all blocks for that User are decoded. In other words, once the partial processing of the MUD processors 410, $MUD_0$ to $MUD_{Turbo-1}$, have finished a full block of data using the partial frame processing, all the MUD data is transferred to the respective decoder 430 for decoding for that particular User. The decoder 430 provides improved data to each subsequent MUD in the User chain.

There are $N_{turbo}$ MUD's 410 running concurrently each separated by a block of data. $MUD_0$ works on data with no significant a priori information from the convolutional code, but with symbol probabilities from some a priori information (e.g. determined by the channel estimates) or assumed equivalent. $MUD_1$ works on data with a priori information from at least one pass through the convolutional decoders. Finally, MUD # $N_{turbo}$-1 works with data having a priori information and passed through the convolutional decoder $N_{turbo}$ times.

With respect to the refreshed or replaced data, as the decoders decode different users, the blocks of data are replaced so that the MUD processing that data sees 'new' data. The old data is generally not 'lost' and can be used for subsequent processing.

Referring to the combination of FIG. 4 and FIG. 5, focusing on the processing for User 2, as $MUD_0$ finishes block i frame of data from User 2 it is also processing block i+1 of User 1. It should be understood that User 1 is ahead in time as compared to User 2 and the block i of User 1 has already been processed and decoded data passed to the BCJR decoder 430 and waits for the next round of decoding. The system decodes User 2 leaving User 1 alone. The $MUD_0$ has already finished with User 2 and while decoding User 2 it sees a complete set of decoded data from User 1 in the BCJR decoder 430 and passes this to $MUD_1$.

The conditional/decision section 440 links to each user in the system and provides the synchronization to switch to whichever User has a full frame of data in the MUD processor 410. Once the conditional/decision or synchronization section locates which User has completed processing of a complete frame, that User is selected for processing. The User's data is decoded and passed to the BCJR decoder 430 for that User. The MUD 410 moves to the next frame boundary and the processing continues by propagating down through the multiple layers and through all Users.

As is readily apparent to those skilled in the art, the MUD detector can pass soft decisions in the form of reliability, or confidence, measures to the bank of decoders. The reliability measures are presented with one associated with each symbol of each user to the bank of decoders. If the signals were transmitted with interleaving, the reliability measures from the MUD are first passed through a deinterleaver (not shown) and passed on in shuffled form to the decoder. Shuffling refers to same values but changes the placement or presentation of the values.

To summarize, multiple MUDs are running wherein the processing of the MUD is interrupted at each frame boundary of the next user. Once an entire block is processed by the MUD, the blocks for that user are decoded. The frame of data is 'replaced' and the processing goes to the next frame boundary for MUD processing. It should be understood that the old data that is replaced by new processed data does not generally result in the old data being lost, as the a priori information of the bits in the block are replaced with more mature processed data.

One of the advantages of pipelined processing in this manner is that computer processing units (CPUs), or processing threads on a multiprocessor system, can be individually assigned to the MUD and decoding processing tasks. In this manner, data latency and processor idle time are minimized to the lowest possible values. This is because each of the MUD processing blocks is continually processing the next symbol in its data path, possibly delayed, but still immediately available to the processor in real-time. In the conventional implementation, the same processor would be computing $MUD_0$, $MUD_1$, and so forth. This processor would therefore have to wait for the results of previous MUD and BCJR decode operations, and would be in an idle state for a significant portion of its time.

It is readily apparent that the TurboMUD technique is used in a variety of applications and with varied methods for implementing the system, and is therefore not limited to the embodiments presented herein. Various variations and modifications may be made without departing from the scope of the present invention.

One application which shows a non-CDMA environment is to the application involving GSM, which is a narrow band TDMA system. The user communicates over a timeslot and when the time slot is filled, another user has to wait until an open slot is available. The present invention allows reassignment of the timeslot so that signals from a second user can overlay a first user. The only distinguishing characteristics would be some phase and power differences that can be employed as described herein to differentiate user 1 from user 2.

Another application of the invention is to allow for multi-user detection for a variety of communications formats and not solely limited to CDMA. Any multiuser system that has user data coded at the source may be processed by the turbo-mud algorithms outlined in this application. The format of the data is not limited to CDMA.

While the operation of the subject system has been described in terms of a wireless communications network, it has application to any situation in which digitally encoded data are processed in a TurboMUD processing. The reference to users and user signals has been present to facilitate ease of understanding in one embodiment for communications. Thus, the subject system has application to any digital processing application such as cable networks and storage mediums. The MUD processing with respect to the storage devices refer to the plurality of signals received when the optical head picks up the signals of the adjacent tracks of the storage mediums. The tight spacing between the tracks creates a multiple user detection problem involving the processing of the desired track signal from the other received tracks.

Numerous characteristics and advantages have been set forth in the foregoing description, together with details of structures and functions of the present invention, and some of the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, not as restrictive The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An apparatus for processing asynchronous data in a multiple access system, comprising:
   A plurality of received signals from a corresponding plurality of users, wherein said received signals are divided into blocks of data for each of said users;
   A plurality of multiuser detector processors coupled to said received signals, wherein each of said multiuser detector processors processes a portion of said blocks for each of said users within a processing window;
   A plurality of decoders coupled to said multiuser detector processors, wherein said decoders process all the blocks for one of the users, once said multiuser detector processor is finished processing an entirety of one of said blocks for the one of said users; and
   A parameter estimator coupled to said received signals and to said multiuser detector processors, wherein a size of said processing window is determined by said parameter estimator.

2. The apparatus according to claim 1, wherein each of said received signals are respectively coupled one of said multiuser detector processors.

3. The apparatus according to claim 1, wherein each of said multiuser detector processors are respectively coupled one of said decoders.

4. The apparatus according to claim 1, wherein said decoders uses algorithms selected from the group of algorithms consisting of: Viterbi algorithm, and Bahl, Cocke, Jelinek, and Raviv (BCJR) algorithm.

5. The apparatus according to claim 1, wherein said multiuser detector processor uses algorithms selected from the group consisting of: M-algorithm, T-algorithm, Fano, or reduced state Viterbi, maximum a posteriori (MAP) decoders and soft-output Viterbi algorithm (SOVA) decoders.

6. The apparatus for digital processing according to claim 1, further comprising an interleaver coupled between said multiuser detector processors and said decoders and a deinterleaver coupled between said decoders and said multiuser detector processors.

7. A digital processing system performing Turbo MUD processing on multiple access communications, comprising:
   A parameter estimation unit coupled to a plurality of received user signals, wherein each of said user signals are a plurality of blocks of data;
   A multiuser detector coupled to said parameter estimation unit, wherein said multiuser detector processes said blocks of data for each of said user signals in a partial manner with a processing window defined by frame boundaries, and wherein said multiuser detector outputs processed blocks of data; and a bank of decoders coupled to said multiuser detector, said decoders processing all of said processed blocks of data for one of said user signals as soon as one of said blocks of data for one of said user signals has been processed by said multiuser detector in its entirety, wherein said decoders produce improved processed blocks of data, and wherein a synchronization section is coupled to each of said user signals and determines which of said processed blocks of data to decode in the multiuser detector.

8. The digital processing system according to claim 7, wherein said improved processed blocks of data are fed back to said multiuser detector for iterative processing.

9. The digital processing system according to claim 7, wherein said processing window is edge triggered.

10. The digital processing system according to claim 7, wherein said processing window is triggered to commence processing on a central bit.

11. The digital processing system according to claim 7, wherein said decoders uses algorithms selected from the group consisting of: Viterbi algorithm, and Bahl, Cocke, Jelinek, and Raviv (BCJR) algorithm.

12. The digital processing system according to claim 7, wherein said multiuser detector uses algorithms selected from at least one of the algorithms from the group of algorithms consisting of: M-algorithm, T-algorithm, Fano, or reduced state Viterbi, maximum a posteriori (MAP) decoders and soft-output Viterbi algorithm (SOVA) decoders.

13. A method for processing signals from multiple users each having synchronized bit streams within blocks of data comprising:

Performing parameter estimation of said bit streams;

Processing said bit streams using a multiuser detector, wherein said multiuser detector processes a portion of each of said blocks of data within a frame boundary;

Interrupting said processing at each said frame boundary, wherein one of said blocks of data is completely processed for one of said users at each said frame boundary;

De-interleaving all of said blocks of data from said multiuser detector;

Decoding all of said blocks of data from said multiuser detector for said one of said users and producing a higher quality symbol bit stream;

Interleaving said higher quality symbol bit stream;

Replacing said one of said blocks of data with said higher quality symbol bit stream;

Repeating said steps of interrupting, deinterleaving, decoding, interleaving and replacing until a final state is obtained; and, Outputting a final symbol stream for each user.

14. The method for processing signals from multiple users according to claim 13, wherein said final state is a fixed number of iterations.

15. The method for processing signals from multiple users according to claim 13, wherein said final state is an allowable performance level.

16. The method for processing signals from multiple users according to claim 13, wherein said processing is performed in parallel.

17. The method for processing signals from multiple users according to claim 13, wherein said processing is performed sequentially.

* * * * *